United States Patent
Forstner et al.

(10) Patent No.: US 7,057,271 B2
(45) Date of Patent: Jun. 6, 2006

(54) APPARATUS FOR CONNECTING AN IC TERMINAL TO A REFERENCE POTENTIAL

(75) Inventors: Johann-Peter Forstner, Steinhoering (DE); Stephan Weber, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/911,381

(22) Filed: Aug. 4, 2004

(65) Prior Publication Data
US 2005/0067697 A1    Mar. 31, 2005

Related U.S. Application Data

(63) Continuation of application No. PCT/EP03/00682, filed on Jan. 23, 2003.

(30) Foreign Application Priority Data
Feb. 4, 2002  (DE) ................................ 102 04 403

(51) Int. Cl.
*H01L 23/52* (2006.01)
*H01L 23/48* (2006.01)
(52) U.S. Cl. ...................... 257/691; 257/780; 257/781; 257/784; 257/775; 438/51; 438/64; 438/127
(58) Field of Classification Search ................ 257/678, 257/691, 780, 781, 784, 786, 775; 438/51, 438/64, 127
See application file for complete search history.

(56) References Cited

U.S. PATENT DOCUMENTS

| | | | |
|---|---|---|---|
| 4,001,872 A * | 1/1977 | Khajezadeh | ................ 257/641 |
| 5,130,784 A | 7/1992 | Saeki et al. | |
| 5,145,795 A | 9/1992 | Sanders et al. | |
| 5,406,114 A | 4/1995 | Brenndoerfer et al. | |
| 6,015,723 A | 1/2000 | Choi | |
| 6,034,415 A | 3/2000 | Johnson et al. | |
| 6,190,978 B1 | 2/2001 | D'Anna | |
| 6,198,168 B1 | 3/2001 | Geusic et al. | |
| 6,297,533 B1 | 10/2001 | Mkhitarian | |

FOREIGN PATENT DOCUMENTS

| | | |
|---|---|---|
| EP | 0 851 492 A2 | 7/1998 |
| EP | 1 156 528 A1 | 11/2001 |

* cited by examiner

*Primary Examiner*—Jasmine Clark
(74) *Attorney, Agent, or Firm*—Maginot, Moore & Beck

(57) ABSTRACT

A circuit chip has an apparatus for an electrically conductive connection of a terminal thereof to an external reference potential. The apparatus has a parallel connection of a bonding wire and a semiconductor area formed in a substrate of the circuit chip. The semiconductor area is doped higher than the substrate of the circuit chip.

20 Claims, 2 Drawing Sheets

PRIOR ART

APPARATUS FOR CONNECTING AN IC TERMINAL TO A REFERENCE POTENTIAL

BACKGROUND OF THE INVENTION

CROSS-REFERENCE TO RELATED APPLICATION

This application is a continuation of copending International Application No. PCT/EP03/00682, filed Jan. 23, 2003, which designated the United States and was not published in English.

1. Field of the Invention

The present invention refers to an apparatus for connecting an IC terminal to a reference potential, and particularly such an apparatus, which is suitable for connecting an IC terminal to a ground potential.

2. Description of the Prior Art

In a plurality of integrated circuits (IC), such as electronic amplifier stages, the performance often depends on the ground connection of the active elements. This is particularly the case for high frequencies. For example, in a frequently used emitter circuit of an electronic amplifier stage, a high impedance connection of the emitter to ground, leads to a gain and efficiency loss.

In the prior art, a plurality of techniques are known to connect pads of an IC chip to an external reference potential.

A frequently used known technique is to connect the ground pads of an IC chip to conductive areas on a substrate where the IC chip is disposed by using bonding wires, wherein the conductive areas define a ground potential. An example of such a connection is shown in FIG. 2a, where an integrated circuit chip (IC chip) 10 is disposed on a substrate, which can for example be a multilayer board. A ground terminal 14 of the IC chip is electrically conductive connected to a substrate ground area 18 by using a bonding wire 16.

Bonding wires, however, have a relatively high inductance, so that a ground connection, as it is shown in FIG. 2a, causes bad high-frequency properties. For inductance reduction it is possible to connect several bonding wires in parallel, wherein then, however, the area requirement increase.

An alternative technique used according to the prior art to connect a pad 14 of a chip 10 with a substrate ground area 18 is shown in FIG. 2b. This is a chip feedthrough, i.e. a chip via 20 of metal, passing through the chip 10 and representing a direct metallic connection between the ground terminal 14 and the substrate ground area 18. However, the generation of chip vias increases the complexity of the production process immensely, especially with regard to a necessary thin polishing, etching or drilling. Above that, there is a risk of fracture during such a production of chip vias.

Finally, it is known from the prior art to use highly doped silicon contacts, which are called sinkers, instead of metal through contacts. Such a sinker 22, which connects a ground terminal 14 of an IC chip 10 to a substrate ground area 18, is schematically shown in FIG. 2c. For producing such a through connection of highly doped silicon, less process steps are necessary than for producing a metal chip via. The connection of highly doped silicon has, however, significantly higher impedance, which reduces the efficiency, for example with power amplifiers. However, both via types, i.e. metal or highly doped silicon are, with regard to the inductance, about one order of magnitude better than the ground connection using a bonding wire, as it has been explained above with reference to FIG. 2a.

SUMMARY OF THE INVENTION

It is the object of the present invention to provide an apparatus for connecting an IC terminal to a reference potential, which enables an improved operational behavior of the IC.

The present invention provides a circuit chip with an apparatus for an electrically conductive connection of a terminal of the same to an external reference potential, characterized in that the apparatus has a parallel connection of a bonding wire and a semiconductor area formed in a substrate of the circuit chip, which is doped higher than the substrate of the circuit chip.

The doped semiconductor material can be formed in the shape of conventional sinkers, i.e. trough connections of a doped semiconductor material. Typical dopings are in an area of $10^{18}$ cm$^{-3}$ to $4 \cdot 10^{20}$ cm$^{-3}$ and particularly in a range of $10^{19}$ cm$^{-3}$ $1 \cdot 10^{20}$ cm$^{-3}$.

The present invention is based on the knowledge that the known ground connections are not optimal in many applications, since on the one hand the inductance of the bonding wires interferes immensely, and on the other hand, even sinker of highly doped semiconductor material, such as silicon, are not optimum due to the ohmic loss. According to the invention, the parallel connection of the lossy sinker to the bonding wire eliminates the disadvantages of the two just mentioned connection types, without making the production process much more complicated. In the parallel circuit of sinker and bonding wire, a high-frequency current mainly flows across the sinker, while a low-frequency current and particularly a direct current flows across the bonding wire or the bonding wires.

BRIEF DESCRIPTION OF THE DRAWINGS

These and other objects and features of the present invention will become clear from the following description taken in conjunction with the accompanying drawings, in which:

FIG. 2C shows a prior art IC chip having a sinker connecting a ground terminal and a substrate ground.

DESCRIPTION OF THE PREFERRED EMBODIMENTS

Figure 1:
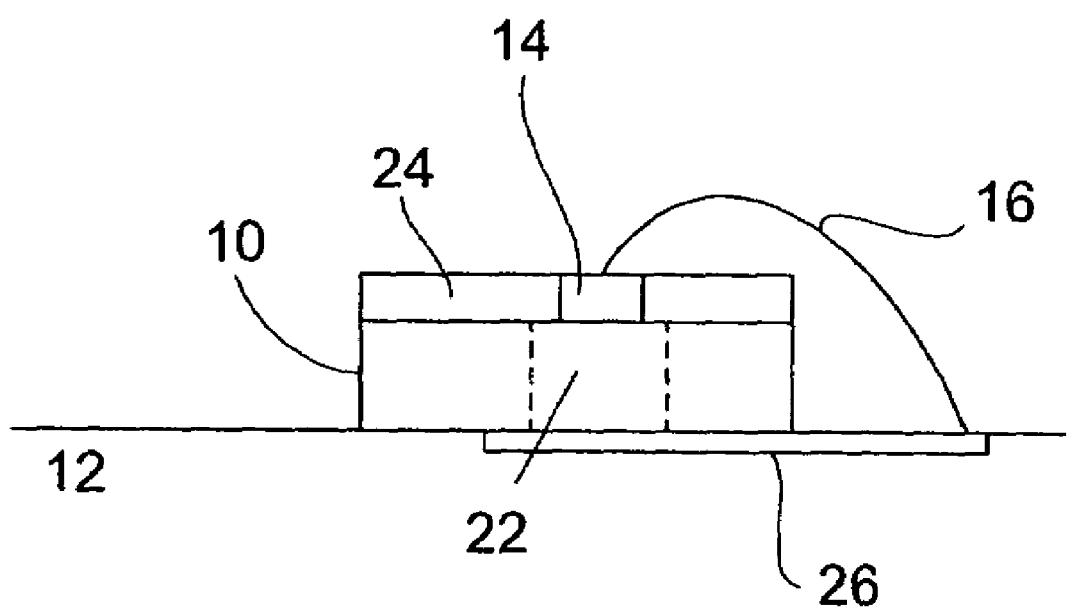
FIG. 1 is a schematical representation of one embodiment of an apparatus for connecting an IC terminal to a reference potential.
Figure 2A:
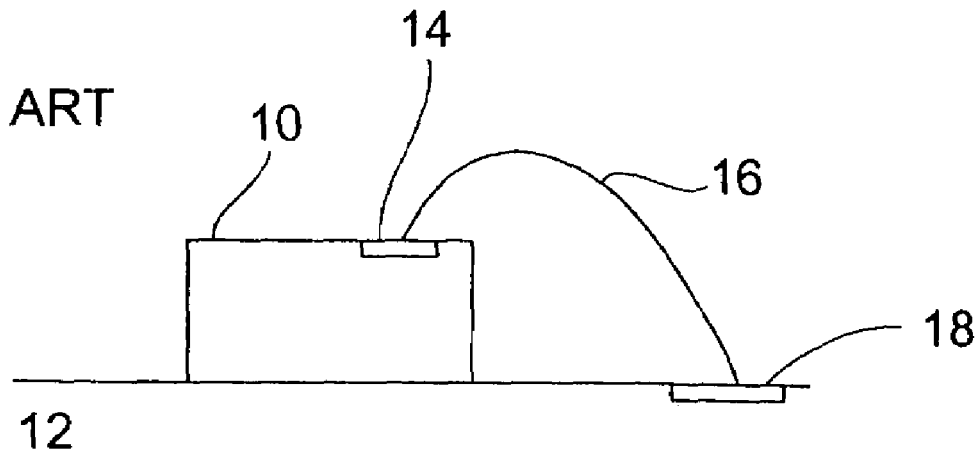
FIG. 2A shows a prior art IC chip connected to a substrate ground using a bonding wire.
Figure 2B:
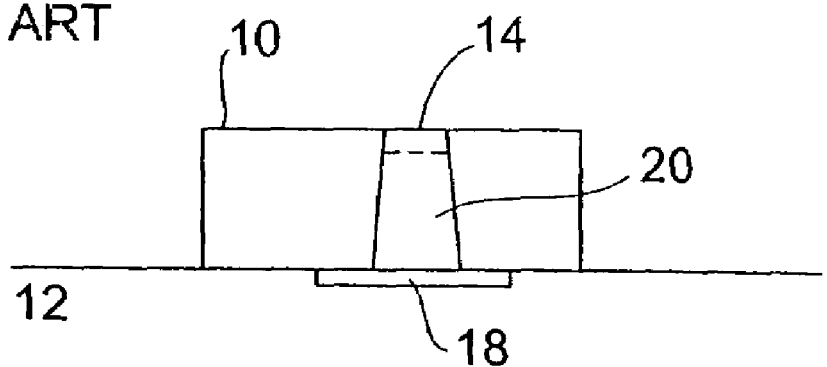
FIG. 2B shows a prior art IC chip having a direct metallic connection between a ground terminal and a substrate ground.

In FIG. 1, an IC chip 10 is disposed on a substrate 12. The IC chip 10 comprises a ground terminal 14, which can be a metallic pad disposed on the IC chip. Further, the circuit chip 10 comprises active areas 24, which are normally formed in areas of the circuit chips 10 facing away from the substrate 12.

The IC chip 10 further comprises a sinker 22, which connects the ground terminal 14 electrically conductive to a substrate ground area 26. Above that, the substrate ground area 26 is electrically conductive connected to the ground terminal 14 of the IC chip 10 via a bonding wire 16.

The sinker 22 can be formed by highly doped areas in an otherwise lower doped chip substrate. This is a doped semiconductor material of a doping type, which is disposed between the ground terminal of the IC chip and the substrate ground area, so that there is no PN transition between them. Typical doping heights can be in a range between $10^{18}$ cm$^{-3}$ to $4 \cdot 10^{20}$ cm$^{-3}$, while preferred doping heights are in a range of $10^{19}$ cm$^{-3}$ to $10^{20}$ cm$^{-3}$. The given doping ranges are advantageous, since in higher dopings, crystal defects and the necessary processing time increase, while in lower dopings the conductivity decreases.

In preferred embodiments of the present invention, the sinker of highly doped silicon cannot extend through the whole substrate, which can have a thickness of about 100 to 300 μm, but extends only across an area of about 3 to 10 μm, since otherwise the process times become too long and, in high dopings, crystal defects can occur. The rest of the way, i.e. of the distance between the ground terminal on the chip and substrate ground area is formed by a uniformly (over the whole wafer) highly doped silicon substrate, which can have a typical conductivity of 1 . . . 10 mΩ·cm. Only where a ground terminal is needed, then, a sinker is produced selectively, to implement the connection through the low-doped substrate areas with a thickness of about 3 to 10 μm.

Alternatively, the whole chip substrate with the exception of the sinker 22 can be undoped or significantly lower doped, respectively. However, it is also possible to use a fully higher doped chip substrate, wherein then appropriate electrical insulations have to be provided between the active areas 24 and the chip substrate, for example by corresponding PN junctions or isolating layers.

The sinker 22 and the bonding wire 16 are connected to the same substrate ground area 26. Alternatively, the sinker 22 and the bonding wire 16 can be connected to different substrate pads, as long as they are on the same reference potential.

By the inventive parallel circuit of doped semiconductor material and bonding wire between a chip terminal and an external pad, which is on a reference potential, a "broadband" connection is generated, since a high-frequency current can flow mainly across the doped semiconductor material, while a low frequency current and particularly a direct current can flow across the bonding wire or the bonding wires, if several bonding wires are provided between chip terminal and external pad.

The inventive apparatus is particularly useful for generating a ground connection of the active elements of electronic amplifier stages to an external ground plane. Particularly, the present invention can advantageously be used to enable a ground connection of an emitter with an external ground area in the frequently used emitter circuit. With external mass area a mass area is meant, which is not part of the IC chip itself. Thus, gain and efficiency loss of electronic amplifier stages can be reduced and avoided, respectively, particularly at high frequencies.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit chip having an electrically conductive connection between a terminal of the circuit chip and an external reference potential, the circuit chip comprising:
   a parallel connection of a bonding wire and a semiconductor area formed in a substrate of the circuit chip, wherein the semiconductor area is doped higher than the substrate of the circuit chip, the doped semiconductor area comprising a doped semiconductor material.

2. The circuit chip according to claim 1, wherein the doped semiconductor material is silicon.

3. The circuit chip according to claim 1, wherein the doped semiconductor material has a doped area of a doping type between the terminal of the circuit chip and the external reference potential, the doped semiconductor material extending through the circuit chip.

4. The circuit chip according to claim 1, wherein the circuit chip is an amplifier stage.

5. The circuit chip according to claim 4, wherein the terminal is an emitter terminal of the amplifier stage.

6. The circuit chip according to claim 1, wherein the reference potential is formed by a conductive area on the substrate.

7. The circuit chip according to claim 1, wherein the doped semiconductor material comprises a sinker.

8. The circuit chip according to claim 1, wherein the reference potential is a ground potential.

9. A circuit chip disposed on a circuit chip substrate and connected to an external reference potential, the circuit chip comprising:
   a. a terminal;
   b. a semiconductor area connected between the terminal and the external reference potential, the semiconductor area comprised of a doped semiconductor material that is doped higher than the circuit chip substrate; and
   c. a wire connected in parallel with the semiconductor area between the terminal and the external reference potential.

10. The circuit chip according to claim 9, wherein the doped semiconductor material is silicon.

11. The circuit chip according to claim 9, wherein the doped semiconductor material extends through the circuit chip between the terminal and the external reference potential.

12. The circuit chip according to claim 9, wherein the circuit chip is an amplifier stage.

13. The circuit chip according to claim 12, wherein the terminal is an emitter terminal of the amplifier stage.

14. The circuit chip according to claim 9, wherein the reference potential is formed by a conductive area on the substrate.

15. The circuit chip according to claim 9, wherein the doped semiconductor material comprises a sinker.

16. The circuit chip according to claim 9, wherein the reference potential is a ground potential.

17. The circuit chip of claim 9 wherein the semiconductor area is connected to the external reference potential at a first pad.

18. The circuit chip of claim 17 wherein the bonding wire is connected to the external reference potential at a second pad.

19. A method of connecting an integrated circuit terminal to at least one pad at ground potential, the method comprising:
   a. providing a circuit chip disposed on a circuit chip substrate;
   b. providing a semiconductor area in the circuit chip, the semiconductor area connected between the terminal and the at least one pad at ground potential, the semiconductor area comprised of a doped semiconductor material that is doped higher than the circuit chip substrate;
   c. connecting a bonding wire between the terminal and the at least one pad at ground potential such that the bonding wire forms a parallel connection with the semiconductor area between the terminal and the at least one pad at ground potential.

20. The method of claim 16 wherein the at least one pad comprises a first pad and a second pad, and wherein the bonding wire is connected to the first pad and the semiconductor area is connected to the second pad.

* * * * *